United States Patent
Choi

(10) Patent No.: US 6,274,409 B1
(45) Date of Patent: Aug. 14, 2001

(54) METHOD FOR MAKING A SEMICONDUCTOR DEVICE

(75) Inventor: Seungmoo Choi, Orlando, FL (US)

(73) Assignee: Agere Systems Guardian Corp., Murray Hill, NJ (US)

(*) Notice: Subject to any disclaimer, the term of this patent is extended or adjusted under 35 U.S.C. 154(b) by 0 days.

(21) Appl. No.: 09/484,759

(22) Filed: Jan. 18, 2000

(51) Int. Cl.$^7$ .................................................. H01L 21/82
(52) U.S. Cl. ........................................ 438/128; 438/618
(58) Field of Search ................................. 438/128, 233, 438/303, 656, 672, 674, 675, 683, 197, 279, 618, 637, 229

(56) References Cited

U.S. PATENT DOCUMENTS

| | | | |
|---|---|---|---|
| 5,668,065 | * | 9/1997 | Lin .................................. 438/303 |
| 5,759,882 | | 6/1998 | Kao et al. ........................ 438/202 |
| 5,807,779 | * | 9/1998 | Liaw ............................... 438/279 |
| 5,899,742 | * | 5/1999 | Sun ................................ 438/682 |
| 5,955,768 | * | 9/1999 | Liaw et al. ...................... 257/383 |

* cited by examiner

Primary Examiner—David Nelms
Assistant Examiner—David Nhu
(74) Attorney, Agent, or Firm—Allen, Dyer, Doppelt, Milbrath & Gilchrist, P.A.

(57) ABSTRACT

A method for making a semiconductor device includes forming a plurality of transistors in a semiconductor substrate, forming a first dielectric layer overlying the semiconductor substrate, and selectively etching the first dielectric layer to form a first opening exposing a first transistor portion and a second transistor portion. Conducting material is deposited into the first opening to define a merged contact between the first transistor portion and the second transistor portion. The method further includes forming a second dielectric layer overlying the first dielectric layer and the merged contact, and selectively etching the second dielectric layer to form a second opening exposing the merged contact, and while selectively etching the second and first dielectric layers to form a third opening exposing a source/drain region of a third transistor to define a self-aligned contact. Conducting material is deposited into the second opening to define a first via with the merged contact, and conducting material is also deposited into the third opening to define a second via with the source/drain region of the third transistor. The self-aligned contact and the merged contact are formed using a reduced number of masks and masking steps.

33 Claims, 4 Drawing Sheets

METHOD FOR MAKING A SEMICONDUCTOR DEVICE

FIELD OF THE INVENTION

The present invention relates to the field of semiconductor processing, and, more particularly, to a method for forming a self-aligned contact (SAC) and a local interconnect (LI) in a semiconductor device.

BACKGROUND OF THE INVENTION

To provide higher device packing density and reduced chip size for metal oxide semiconductor field effect transistor (MOSFET) integrated circuits, a number of design rules have been developed to alleviate alignment error problems between different interconnect layers. These design rules provide sufficient tolerance to mask misalignment and other process variations so that integrated circuits can be reliably manufactured.

Two design rules relate to forming a self-aligned contact (SAC) and a local interconnect (LI). These design rules are commonly used for memories, including DRAMs and SRAMs. Self-aligned contact as used herein refers generally to a source or drain contact which is formed such that it may overlap an adjacent gate. The overlap is permissible because the self-aligned contact is formed in a manner which provides additional isolation between the contact and the gate so that shorting is prevented. Local interconnect refers generally to any interconnection between elements of a semiconductor device, such as an interconnection between a gate, source or drain of one transistor and a gate, source or drain of another transistor in the same device.

However, a self-aligned contact and a local interconnect cannot be formed at the same time. This is primarily due to a difference in the etch selectivity required when etching through an overlying dielectric layer to a transistor source/drain region versus a transistor gate. The offset height between the transistor source/drain region and the transistor gate results in the use of separate masking steps. One additional mask is required for the self-aligned contact, and one additional mask is required for the local interconnect. Thus, two additional masks and masking steps are required to form both the self-aligned contact and the local interconnect in a semiconductor device.

SUMMARY OF THE INVENTION

In view of the foregoing background, it is therefore an object of the present invention to reduce the number of masks and masking steps needed when making a semiconductor device having both a self-aligned contact and local interconnect.

This and other objects, advantages and features in accordance with the present invention are provided by a method for making a semiconductor device comprising the steps of forming a plurality of transistors in a semiconductor substrate, forming a first dielectric layer overlying the semiconductor substrate, and selectively etching the first dielectric layer to form a first opening exposing a first transistor portion and a second transistor portion. Conducting material is preferably deposited into the first opening to define a merged contact between the first transistor portion and the second transistor portion. The merged contact is advantageously formed at a zero window level, and provides a relatively large landing pad area for subsequent processing steps.

The method preferably further comprises the steps of forming a second dielectric layer overlying the first dielectric layer and the merged contact, selectively etching the second dielectric layer to form a second opening exposing the merged contact, and while selectively etching the second and first dielectric layers to form a third opening exposing a source/drain region of a third transistor. Conducting material is preferably deposited into the second opening to define a first via with the merged contact, and conducting material is also deposited into the third opening to define a second via with the source/drain region of the third transistor to define a self-aligned contact.

The self-aligned contact is advantageously formed at a first window level using one additional mask after forming the merged contact at the zero window level. The term merged contact as used herein refers generally to a combination of the self-aligned contact and the local interconnect. The zero window level is primarily used for forming local interconnects. However, the merged contact is not a true local interconnect since it does not cross over the field oxide of the semiconductor device.

Moreover, over etching the merged contact while exposing the source/drain region of the third transistor is acceptable since the thickness of the merged contact is sufficient to prevent damage to the underlying transistors during the etching process. The self-aligned contact thus does not require an additional mask after forming the merged contact. Consequently, a cost reduction is obtained by reducing the number of masks and masking steps when making a semiconductor device having both a self-aligned contact and local interconnect.

The first dielectric layer preferably has a thickness substantially equal to a thickness of the second dielectric layer. More particularly, the first dielectric layer preferably has a thickness less than about 500 nm. The method further comprises the steps of planarizing an upper surface of the first dielectric layer and the merged contact, and planarizing an upper surface of the second dielectric layer and the first and second vias. The plurality of transistors are preferably connected to define at least one memory cell in an SRAM.

DETAILED DESCRIPTION OF THE DRAWINGS

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
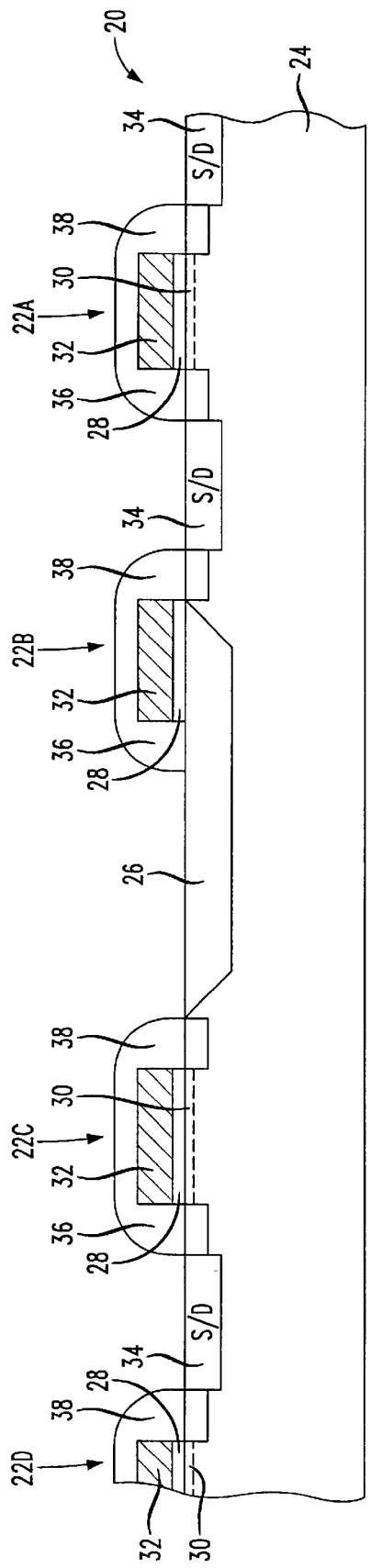
FIGS. 1–3 are cross-sectional views of a semiconductor device illustrating the process steps in accordance with the present invention.
Figure 2:
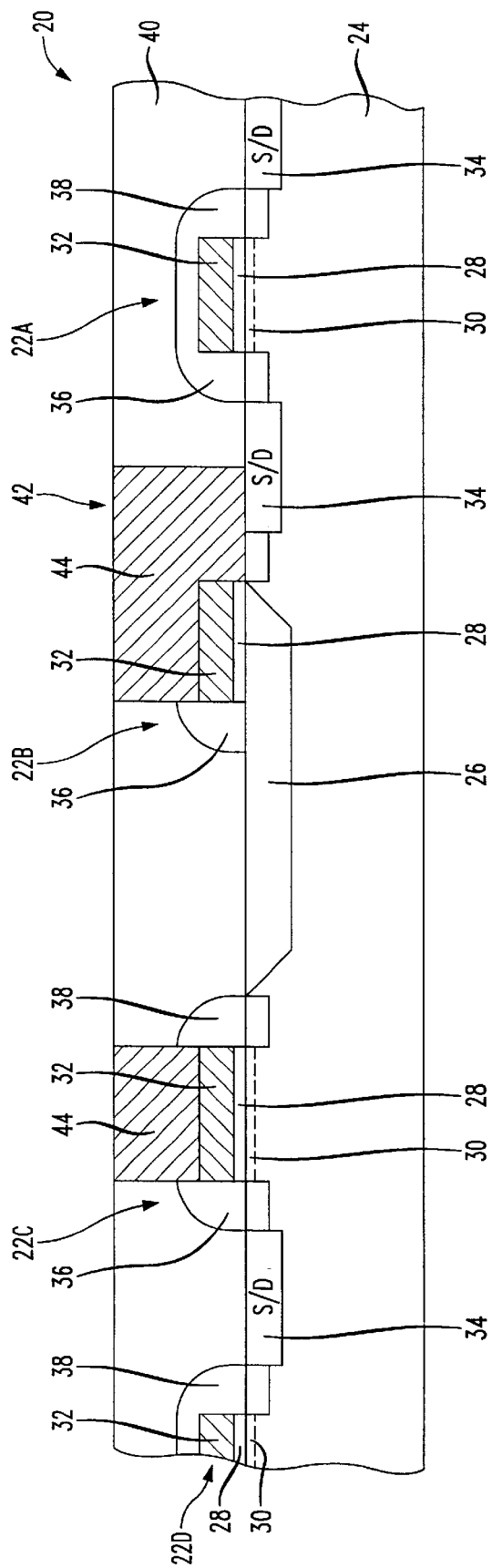
Figure 3:
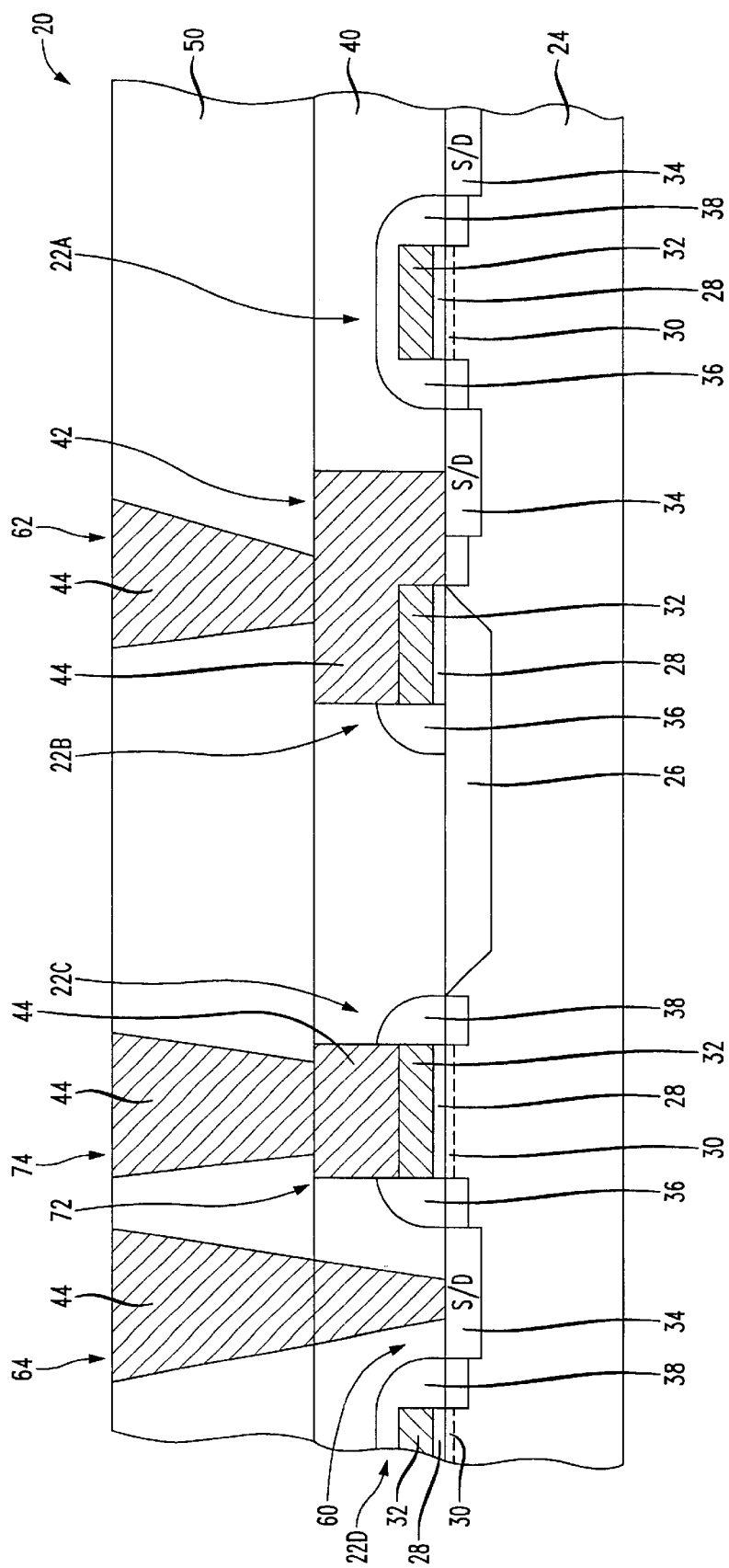
Figure 4:
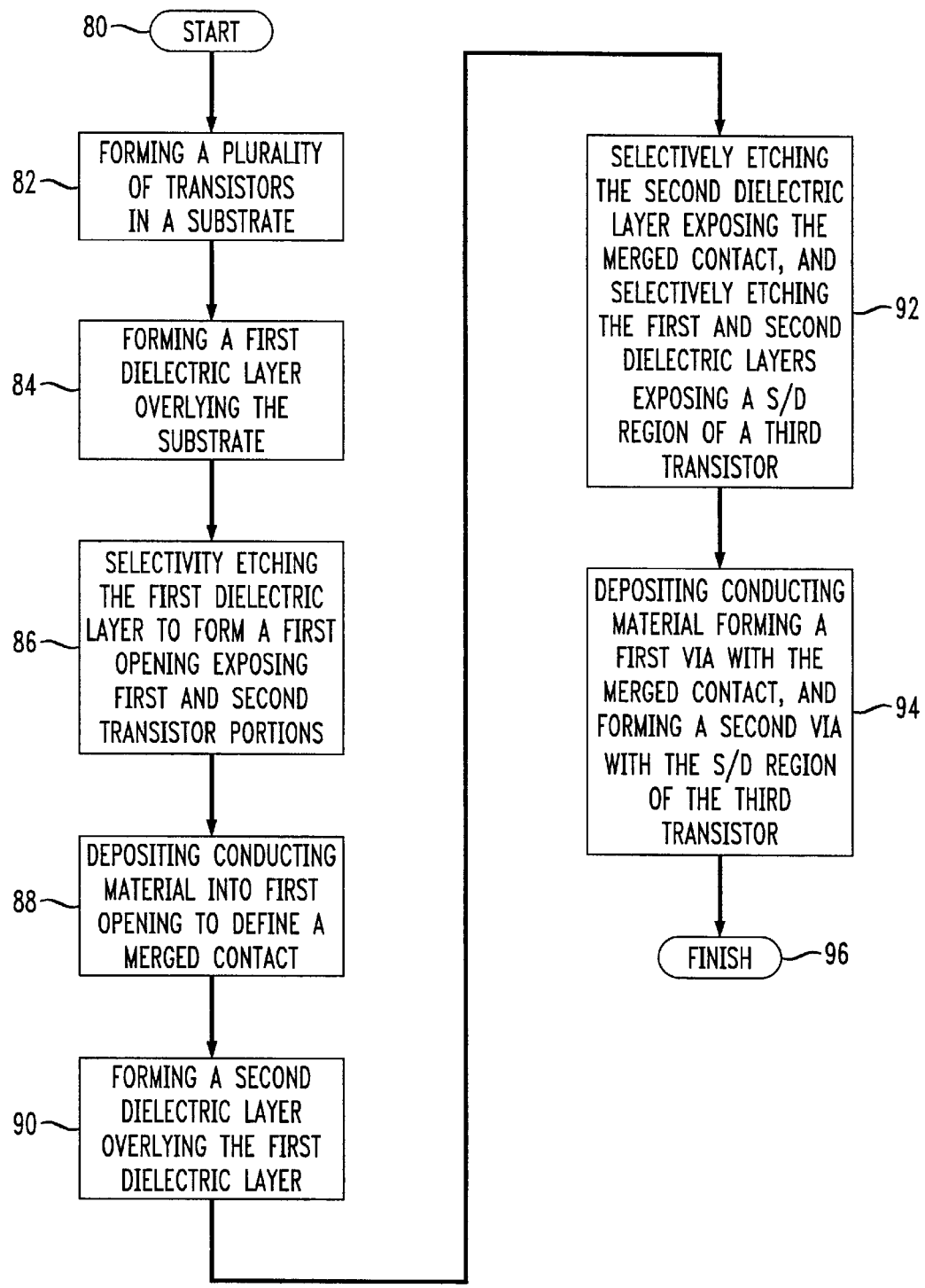
FIG. 4 is a flowchart illustrating the method for making a semiconductor device in accordance with the present invention.

A method for making a semiconductor device 20 in accordance with the present invention will be described with reference to FIGS. 1–4. From the start (Block 80), a plurality of metal oxide semiconductor field effect transistors (MOSFETS) are formed in a semiconductor substrate 24 at Block 82 and as shown in FIG. 1. For purposes of illustrating the present invention, only four transistors 22A–22D are shown in FIGS. 1–3. The semiconductor substrate 24 preferably comprises silicon, and a shallow trench isolation area 26 separates two of the transistors 22B and 22C. The shallow trench isolation area 26 is filled with silicon dioxide, for example, as will be readily appreciated and understood by one skilled in the art.

Each transistor 22A–22D includes a gate dielectric layer 28 over a channel region 30, and the dielectric layer separates the channel region from an overlying gate 32. The gate 32 is preferably a metal or doped polysilicon layer. Each transistor 22A–22D further includes shared doped source/drain regions 34 in the semiconductor substrate 24. Spacers 36, 38 are formed around the sidewalls of each gate 32. The spacers 36, 38 comprise silicon nitride, for example, and protect the gate 32 from subsequent etching steps, as will be readily understood by one skilled in the art.

The term local interconnect as used herein refers generally to any interconnection between elements of a semiconductor device, such as an interconnection between a gate, source or drain of one transistor to a gate, source or drain of another transistor in the same device. The term self-aligned contact as used herein refers generally to a source or drain contact which is formed such that it may overlap an adjacent gate. As will be described in further detail below, the term merged contact as used herein refers generally to a combination of the self-aligned contact and the local interconnect. The merged contact is defined at a zero window level, which is the same level at which a local interconnect is formed. However, the merged contact does not cross over the field oxide of the semiconductor device, and is not a true local interconnect, hence the term merged contact.

In one embodiment, the plurality of transistors 22A–22D are connected together so that the semiconductor device 20 is a memory. For example, the plurality of transistors 22A–22D plus two additional transistors which are not shown are connected together to define a memory cell in an SRAM, as will be readily appreciated by one skilled in the art. However, the method according to the present invention is applicable to other type memories and devices, as will be further appreciated by one skilled in the art.

A first dielectric layer 40 is deposited overlying the semiconductor substrate 24 at Block 84 and as best shown in FIG. 2. The first dielectric layer 40 preferably has a thickness sufficient to cover the transistor gates 32, including the silicon nitride defining the respective spacers 36, 38 adjacent the sidewalls thereof. For example, the first dielectric layer 40 may have a thickness less than about 500 nm.

The first dielectric layer is selectively etched at Block 86 to form a first opening exposing a first transistor portion of transistor 22A and a second transistor portion of transistor 22B. The first transistor portion comprises a shared source/drain region 34 and the second transistor portion comprises a gate 32. For example, the gate 32 of the second transistor 22B is a polygate in an SRAM connecting two adjacent transistor gates together, and the source/drain region 34 of the first transistor 22A is an access transistor connected thereto, as will be readily understood by one skilled in the art.

The method further includes the step of forming a merged contact 42 between the first and second transistor portions 32, 34 by depositing conducting material 44 into the first opening at Block 88. The upper surface of the first dielectric layer 40 and the merged contact 42 are planarized, such as by a chemical mechanical polishing (CMP) process.

A second dielectric layer 50 is formed overlying the first dielectric layer 40 and the merged contact 42 at Block 90. In one embodiment, the second dielectric layer 50 has a thickness substantially equal to a thickness of the first dielectric layer 40. However, the thickness can be significantly greater if necessary for planarizing the second dielectric layer 50.

The second dielectric layer 50 is selectively etched at Block 92 to form a second opening exposing the merged contact 42, and a third opening is also formed by exposing a source/drain region 34 of a third transistor 22C. Conducting material 44 is deposited into the second opening at Block 94 forming a first via 62 with the merged contact 42, and conducting material is deposited into the third opening forming a second via 64 with the source/drain region 34 of the third transistor 22C to define a self-aligned contact 60. An upper surface of the second dielectric layer 50 and the first and second vias 62, 64 are planarized, such as by a CMP process The method for making the semiconductor device 20 is completed at Block 96.

Over etching the merged contact 42 while exposing the source/drain region 34 of the third transistor 22C is acceptable since the thickness of the merged contact 42 is sufficient to prevent damage to the underlying transistors 22A and 22B during the etching process. The self-aligned contact 60 does not require an additional mask after forming the merged contact. Consequently, a cost reduction is obtained by reducing the number of masks when making a semiconductor device 20 having both a self-aligned contact and local interconnect.

Referring to FIG. 3, the method further includes the steps for forming a standard contact to the gate 32 of the third transistor 22C when forming the merged contact 42 and the self-aligned contact 60. More particularly, selectively etching the first dielectric layer 40 further comprises forming a fourth opening exposing a fourth transistor portion, i.e., gate 32, for example, and forming a first connection 72 with the fourth transistor portion by depositing conducting material 44 into the fourth opening.

The second dielectric layer 50 also overlies the first connection 72. The step of selectively etching the second dielectric layer 50 further comprises defining a fifth opening exposing a portion of the first connection 72, and wherein depositing the conducting material 44 further comprises forming a third via 74 with the first connection. The upper surface of the first connection 72 has an enlarged area to serve as a landing pad when forming the third via 74. Similarly, the merged contact 42 has an enlarged area to serve as a landing pad for the first via 62. This aspect of the invention advantageously allows for a more relaxed photolithography process, as readily appreciated by one skilled in the art.

The conducting material 44 comprises tungsten, and the first and second dielectric layers 40, 50 comprise silicon dioxide. However, other metals and other types of dielectric layers may be used, as will be readily appreciated by one skilled in the art.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making a semiconductor device comprising the steps of:

forming a plurality of transistors in a semiconductor substrate;

forming a first dielectric layer overlying the semiconductor substrate;

selectively etching the first dielectric layer to form a first opening exposing a first transistor portion and a second transistor portion;

depositing conducting material into the first opening to define a merged contact between the first transistor portion and the second transistor portion;

forming a second dielectric layer overlying the first dielectric layer and the merged contact;

selectively etching the second dielectric layer to form a second opening exposing the merged contact, and while selectively etching the second and first dielectric layers to form a third opening exposing a source/drain region of a third transistor; and depositing conducting material into the second opening to define a first via with the merged contact, and while depositing conducting material into the third opening to define a second via with the source/drain region of the third transistor to define a self-aligned contact.

2. A method according to claim 1 wherein selectively etching the first dielectric layer further comprises forming a fourth opening exposing a fourth transistor portion; and further comprising forming a first connection with the fourth transistor portion by depositing conducting material into the fourth opening.

3. A method according to claim 2 wherein forming a second dielectric layer also overlies the first connection; wherein selectively etching the second dielectric layer further comprises defining a fifth opening exposing a portion of the first connection; and wherein depositing conducting material further comprises forming a third via with the first connection.

4. A method according to claim 1 wherein the first dielectric layer has a thickness substantially equal to a thickness of the second dielectric layer.

5. A method according to claim 1 wherein the first dielectric layer has a thickness less than about 500 nm.

6. A method according to claim 1 further comprising the step of planarizing an upper surface of the first dielectric layer and the merged contact.

7. A method according to claim 6 wherein the step of planarizing comprises chemical mechanical polishing.

8. A method according to claim 1 wherein the conducting material comprises tungsten.

9. A method according to claim 1 wherein the first and second transistor portions comprise at least one of a source/drain region and a gate.

10. A method according to claim 1 wherein the plurality of transistors are connected together define at least one memory cell in an SRAM.

11. A method according to claim 1 wherein the first and second dielectric layers comprise silicon dioxide.

12. A method for making a semiconductor device comprising the steps of:

forming a plurality of transistors in a semiconductor substrate;

forming a first dielectric layer overlying the semiconductor substrate;

selectively etching the first dielectric layer to form a first opening exposing a first transistor portion and a second transistor portion;

depositing conducting material into the first opening to define a merged contact between the first transistor portion and the second transistor portion;

forming a second dielectric layer overlying the first dielectric layer and the merged contact;

selectively etching the second dielectric layer to form a second opening exposing the merged contact; and depositing conducting material into the second opening to define a first via with the merged contact.

13. A method according to claim 12 wherein selectively etching the second dielectric layer further comprises selectively etching the second and first dielectric layers to form a third opening exposing a source/drain region of a third transistor; and wherein depositing conducting material into the second opening further comprises depositing conducting material into the third opening to define a second via with the source/drain region of the third transistor to define a self-aligned contact.

14. A method according to claim 12 wherein selectively etching the first dielectric layer further comprises forming a fourth opening exposing a fourth transistor portion; and further comprising forming a first connect ion with the fourth transistor portion by depositing conducting material into the fourth opening.

15. A method according to claim 14 wherein forming a second dielectric layer also overlies the first connection; wherein selectively etching the second dielectric layer further comprises defining a fifth opening exposing a portion of the first connection; and wherein depositing conducting material further comprises forming a third via with the first connection.

16. A method according to claim 12 wherein the first dielectric layer has a thickness substantially equal to a thickness of the second dielectric layer.

17. A method according to claim 12 wherein the first dielectric layer has a thickness less than about 500 nm.

18. A method according to claim 12 further comprising the step of planarizing an upper surface of the first dielectric layer and the merged contact.

19. A method according to claim 12 further comprising the step of planarizing an upper surface of the second dielectric layer and the first and second vias.

20. A method according to claim 12 wherein the conducting material comprises tungsten.

21. A method according to claim 12 wherein the first and second transistor portions comprise at least one of a source/drain region and a gate.

22. A method according to claim 12 wherein the plurality of transistors are connected together define at least one memory cell in an SRAM.

23. A method according to claim 12 wherein the first and second dielectric layers comprise silicon dioxide.

24. A method for making a memory comprising the steps of:

forming a plurality of memory cells in a semiconductor substrate, each memory cell comprising at least one transistor;

forming a first dielectric layer overlying the semiconductor substrate;

selectively etching the first dielectric layer to form a first opening exposing a first transistor portion and a second transistor portion;

depositing conducting material into the first opening to define a merged contact between the first transistor portion and the second transistor portion;

forming a second dielectric layer overlying the first dielectric layer and the merged contact;

selectively etching the second dielectric layer to form a second opening exposing the merged contact, and while selectively etching the second and first dielectric layers to form a third opening exposing a source/drain region of a third transistor; and depositing conducting material into the second opening to define a first via with the merged contact, and while depositing conducting material into the third opening to define a second via with the source/drain region of the third transistor to define a self-aligned contact.

25. A method according to claim 24 wherein selectively etching the first dielectric layer further comprises forming a fourth opening exposing a fourth transistor portion; and further comprising forming a first connect ion with the fourth transistor portion by depositing conducting material into the fourth opening.

26. A method according to claim 25 wherein forming a second dielectric layer also overlies the first connection; wherein selectively etching the second dielectric layer further comprises defining a fifth opening exposing a portion of the first connection; and wherein depositing conducting material further comprises forming a third via with the first connection.

27. A method according to claim 24 wherein the first dielectric layer has a thickness substantially equal to a thickness of the second dielectric layer.

28. A method according to claim 24 wherein the first dielectric layer has a thickness less than about 500 nm.

29. A method according to claim 24 further comprising the step of planarizing an upper surface of the first dielectric layer and the merged contact.

30. A method according to claim 24 further comprising the step of planarizing an upper surface of the second dielectric layer and the first and second vias.

31. A method according to claim 24 wherein the conducting material comprises tungsten.

32. A method according to claim 24 wherein the plurality of transistors are connected together define at least one memory cell in an SRAM.

33. A method according to claim 24 wherein the first and second dielectric layers comprise silicon dioxide.

* * * * *

UNITED STATES PATENT AND TRADEMARK OFFICE
CERTIFICATE OF CORRECTION

PATENT NO. : 6,274,409 B1
DATED : August 14, 2001
INVENTOR(S) : Seungmoo Choi

It is certified that error appears in the above-identified patent and that said Letters Patent is hereby corrected as shown below:

Column 5,
Line 54, delete "together define" insert -- together to define --

Column 6,
Line 24, delete "connect ion" insert -- connection --
Line 53, delete "together define" insert -- together to define --

Column 7,
Line 20, delete "connect ion" insert -- connection --

Column 8,
Line 21, delete "together define" insert -- together to define --

Signed and Sealed this

Twenty-sixth Day of February, 2002

Attest:

Attesting Officer

JAMES E. ROGAN
Director of the United States Patent and Trademark Office